(12) United States Patent
Kuo et al.

(10) Patent No.: US 9,666,660 B2
(45) Date of Patent: May 30, 2017

(54) SEMICONDUCTOR STRUCTURES INCLUDING METAL INSULATOR METAL CAPACITOR

(71) Applicant: TAIWAN SEMICONDUCTOR MANUFACTURING COMPANY, LTD., Hsinchu (TW)

(72) Inventors: Fang-Ting Kuo, Zhubei (TW); Ren-Wei Xiao, Shetou Township (TW); Sheng Yu Lin, Taoyuan (TW); Chia-Wei Liu, Zhubei (TW); Chun Hua Chang, Zhubei (TW); Chien-Ying Wu, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 89 days.

(21) Appl. No.: 13/969,356

(22) Filed: Aug. 16, 2013

(65) Prior Publication Data

US 2015/0048483 A1 Feb. 19, 2015

(51) Int. Cl.
*H01L 29/92* (2006.01)
*H01L 49/02* (2006.01)
*H01L 23/522* (2006.01)

(52) U.S. Cl.
CPC .......... *H01L 28/60* (2013.01); *H01L 23/5223* (2013.01); *H01L 28/65* (2013.01)

(58) Field of Classification Search
CPC ................. H01L 23/5223; H01L 28/40–28/92
See application file for complete search history.

(56) References Cited

U.S. PATENT DOCUMENTS

| | | | |
|---|---|---|---|
| 2005/0139886 A1* | 6/2005 | Choi ................. | H01L 21/76802 257/296 |
| 2007/0034924 A1* | 2/2007 | Takewaki et al. ............ | 257/296 |
| 2007/0045702 A1* | 3/2007 | Liang ............................ | 257/306 |
| 2008/0174015 A1* | 7/2008 | Herrin et al. ................. | 257/741 |
| 2009/0014835 A1* | 1/2009 | Furumiya et al. ............ | 257/535 |
| 2009/0267185 A1* | 10/2009 | Osada et al. .................. | 257/532 |
| 2010/0270643 A1* | 10/2010 | Iwaki ............................ | 257/532 |
| 2010/0301451 A1* | 12/2010 | Iwaki ............................ | 257/532 |
| 2013/0083586 A1* | 4/2013 | Petitprez ............... | H01L 23/544 365/102 |
| 2013/0334659 A1* | 12/2013 | Liu et al. ...................... | 257/532 |
| 2014/0035099 A1* | 2/2014 | Lehr ............................. | 257/532 |

\* cited by examiner

*Primary Examiner* — Eric Ward
(74) *Attorney, Agent, or Firm* — Hauptman Ham, LLP (57) ABSTRACT

A metal insulator metal (MIM) capacitor includes a base layer and a copper bulk layer in the base layer. The MIM capacitor further includes an etch stop layer over the base layer and the copper bulk layer and an oxide-based dielectric layer over the etch stop layer. The MIM capacitor further includes a capacitor bottom layer over the oxide-based dielectric layer, an insulator layer over the capacitor bottom layer, and a capacitor top layer over the insulator layer.

20 Claims, 5 Drawing Sheets

SEMICONDUCTOR STRUCTURES INCLUDING METAL INSULATOR METAL CAPACITOR

RELATED APPLICATIONS

This application is related to U.S. application Ser. No. 13/161,076; entitled "Semiconductor Structures and Methods of Forming the Same" filed Jun. 15, 2011, the entirety of which is hereby incorporated by reference.

BACKGROUND OF THE DISCLOSURE

In general, a capacitor includes two conductive electrodes on opposing sides of a dielectric or other insulating layer, and may be categorized based on the materials employed to form the electrodes. For example, in a metal-insulator-metal (MIM) capacitor, the electrodes substantially comprise metallic materials. MIM capacitors offer the advantage of a relatively constant value of capacitance over a relatively wide range of voltages applied thereto. MIM capacitors also exhibit a relatively small parasitic resistance.

In integrated circuit designs, on-chip capacitors are used in various applications including dynamic random access memories (DRAM), voltage controlled oscillators (VCO), phase-lock loops, operational amplifiers and other circuit designs. On-chip capacitors are also used to decouple circuits from noise in a separate portion of an electrical system.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Three-dimensional integrated circuits (3D IC) have been proposed to integrate more transistors and circuits in a given area. In a process of forming a 3D IC, two dies, each including respective integrated circuits, are disposed to opposing surfaces of an interposer. Through-substrate-via (TSV) structures, also referred to as through-wafer-via structures, are formed in the interposer, providing electrical connection between the dies.

An interposer includes a substrate through which a TSV structure is formed. A dielectric layer is formed over the TSV structure. A copper bulk which is wider than the TSV structure is formed in the dielectric layer and in contact with the TSV structure. An etch stop layer is then formed on the dielectric layer.

To provide a charge storage, a MIM capacitor is formed on the etch stop layer. A method of forming the MIM capacitor that is known to the applicants includes forming capacitor plate/capacitor dielectric/capacitor plate layers on the etch stop layer. A removal process using chemicals removes portions of the layers to pattern the MIM capacitor. The applicants find that the removal process over removes the etch stop layer that is directly under the layers in some instances, attacking hillocks of the copper bulk. The chemicals of the removal process result in the corrosion at the top surface of the copper bulk. If a via plug is formed over and in contact with the corroded copper bulk, an open electrical connection between the via plug and the corroded copper bulk occurs, in some instances.

Figure 1:
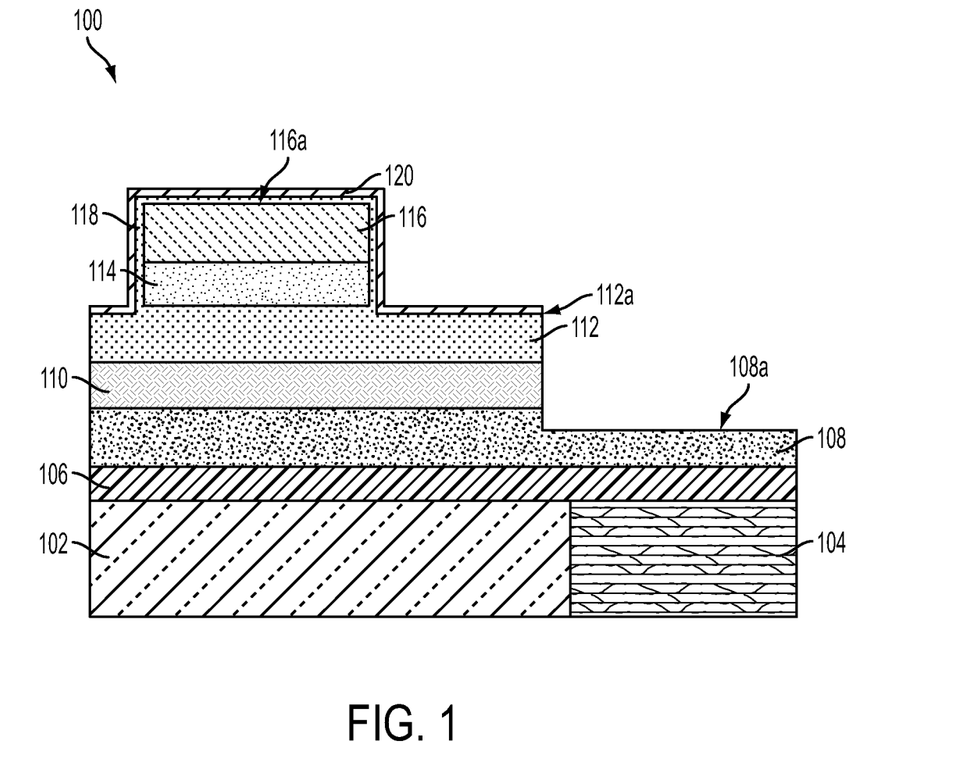
FIG. 1 is a cross-sectional view of metal insulator metal (MIM) capacitor in accordance with one or more embodiments.

FIG. 1 is a cross-sectional view of a metal insulator metal (MIM) capacitor 100 in accordance with one or more embodiments. MIM capacitor 100 includes a base layer 102 and a copper bulk layer 104 in the base layer. An etch stop layer 106 is over base layer 102 and copper bulk layer 104. An oxide-based dielectric layer 108 is over etch stop layer 106. A top surface 108a of oxide-based dielectric layer 108 is a location for forming a contact with copper bulk layer 104. A capacitor bottom layer 110 is over oxide-based dielectric layer 108. An insulator layer 112 is over capacitor bottom layer 110. A top surface 112a of insulator layer 112 is a location for forming a contact with capacitor bottom layer 110. A capacitor top layer 114 is over insulator layer 112. A protection layer 116 is over capacitor top layer 114. A top surface 116a of protection layer 116 is a location for forming a contact with capacitor top layer 114. A top dielectric layer 118 is over top surface 116a and top surface 112a. Top dielectric layer 118 also covers sidewalls of capacitor top layer 114 and protection layer 116. A cap layer 120 is over top dielectric layer 118.

Base layer 102 is part of a support structure. In some embodiments, base layer 102 is part of an interposer. In some embodiments, the interposer is configured to provide electrical connection in a 3-dimensional (3-D) integrated circuit package system. In some embodiments, the interposer includes at least one passive device, e.g., a capacitor, a resistor, and/or an inductor. In some embodiments, the interposer is substantially free from including any active device, e.g., metal-oxide-semiconductor (MOS) transistors, bipolar junction transistors (BJTs), complementary MOS (CMOS) transistors, etc. In some embodiments, the interposer can be referred to as a passive interposer.

In some embodiments, MIM capacitor 100 includes various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, devices, circuits, and/or any combinations thereof.

In some embodiments, base layer 102 is a substrate. In some embodiments, the substrate includes an elementary semiconductor including silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Copper bulk layer 104 is in base layer 102 to provide electrical connection between various circuitry in the base layer or another portion of a 3D IC. In some embodiments, copper bulk layer 104 continuously extends through base layer 102. In some embodiments, copper bulk layer 104 includes at least one barrier material and at least one conductive material. The at least one barrier material includes, for example, titanium, titanium-nitride, tantalum, tantalum-nitride, other barrier materials, and/or combinations thereof. The at least one conductive material includes, for example, aluminum, copper, aluminum-copper, polysilicon, other suitable conductive materials, and/or combinations thereof.

Etch stop layer 106 is disposed over base layer 102 and copper bulk layer 104. Etch stop layer 106 helps to reduce a risk of an etching process etching through the etch stop layer and removing material from base layer 102 or copper bulk layer 104. In some embodiments, etch stop layer 106 is made of at least one material, such as silicon nitride, silicon oxynitride, silicon carbide, silicon oxycarbide, silicon carbon nitride, other suitable dielectric materials, and/or any combinations thereof.

Oxide-based dielectric layer 108 is disposed over etch stop layer 106. Oxide-based dielectric layer 108 provides a buffer between the etch stop layer 106 and a later formed inter metal dielectric (IMD) layer, which further reduces the risk of an etching process etching through the etch stop layer and removing material from base layer 102 or copper bulk layer 104. During formation of copper bulk layer 104 and etch stop layer 106, hillocks or bumps in a top surface of the copper bulk layer are common. A hillock in copper bulk layer 104 will impact a surface profile of etch stop layer 106 resulting in a corresponding hillock in the etch stop layer. Sidewalls and corners of a hillock in etch stop layer 106 are thinner than other portions of the etch stop layer. During an etching process, such as that used to form a contact, the thinner portions of etch stop layer 106 are insufficient to prevent etching through the etch stop layer, in some instances. As a result, copper bulk layer 104 or base layer 102 are damaged by the etching process. In some instances where the damage is significant, a later formed contact will not electrically connect to copper bulk layer 104 and will be incapable of transferring electrical signals to the copper bulk layer, resulting in a non-functional device.

Oxide-based dielectric layer 108 has a thickness ranging from about 50 angstroms (Å) to about 2000 Å. If a thickness of oxide-based dielectric layer 108 is too thin, the oxide-based dielectric layer will not provide adequate protection of etch stop layer 106, in some instances. If a thickness of oxide-based dielectric layer 108 is too great, etching and processing times for forming a contact with copper bulk layer 104 are increased, which increases a risk of damage to capacitor top layer 114.

A material of oxide-based dielectric layer 108 is selected to have similar etch characteristics, e.g., etch rates in common etchants, as a later formed IMD layer, so that etch stop layer 106 is able to continue functioning as an etch stop layer during a contact formation process. If a material of oxide-based dielectric layer 108 as a sufficiently dissimilar etch characteristics, etching time during contact formation will be increased, which will increase a risk of damage to top capacitor layer 114. In some embodiments, oxide-based dielectric layer 108 includes silicon oxide, TEOS (tetraethoxysilane; tetraethylorthosilicate; tetraethelorthosilicate; tetrethoxysilicide) oxide, a silicon-rich silicon oxide, or another suitable oxide-based dielectric material. A silicon-rich silicon oxide is a silicon oxide which includes more than 50% silicon.

Top surface 108a is not covered by capacitor bottom layer 110 and provides a location for forming a contact to electrically connect to copper bulk layer 104. In some instances, top surface 108a includes at least one hillock corresponding to a hillock in copper bulk layer 104. Despite the presence of a hillock in top surface 108a, additional thickness provided by oxide-based dielectric layer 108 reduces the risk of etch through to copper bulk layer 104 during contact formation.

Capacitor bottom layer 110 is over oxide-based dielectric layer 108. Capacitor bottom layer 110 includes a conductive material used to form part of an MIM capacitor. In some embodiments, capacitor bottom layer 110 includes a metallic material. In some embodiments, the metallic material includes aluminum, copper, aluminum copper, tantalum, tantalum nitride, titanium, titanium nitride, tantalum silicon nitride, tungsten, tungsten nitride, other metallic materials, and/or any combinations thereof.

Insulator layer 112 is over capacitor bottom layer 110. Insulator layer 112 includes an insulator material used to form an MIM capacitor. In some embodiments, insulator layer 112 has a dielectric constant that is equal to or higher than that of a silicon dioxide, e.g., about 3.9. To increase a capacitance of MIM capacitor 100, a thickness of insulator layer 112 is reduced and/or a high dielectric constant (high-k) material is used as the insulator layer, in some embodiments. For example, insulator layer 112 includes silicon oxynitride, silicon nitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other dielectric materials, and/or any combinations thereof.

Top surface 112a is not covered by capacitor top layer 114 and provides a location for forming a contact to electrically connect to capacitor bottom layer 110.

Capacitor top layer 114 is over insulator layer 112. Capacitor top layer 114 includes a conductive material used to form part of an MIM capacitor. In some embodiments, capacitor top layer 114 includes a metallic material. In some embodiments, the metallic material includes aluminum, copper, aluminum copper, tantalum, tantalum nitride, titanium, titanium nitride, tantalum silicon nitride, tungsten, tungsten nitride, other metallic materials, and/or any combinations thereof. In some embodiments, capacitor top layer 114 includes a same material as capacitor bottom layer 110. In some embodiments, capacitor top layer 114 includes a different material from capacitor bottom layer 110.

Protection layer 116 is over capacitor top layer 114. Protection layer 116 helps to protect capacitor top layer 114 during a contact formation process. Protection layer 116 includes a different material from the later formed IMD layer and has different etching characteristics from the later formed IMD layer. A thickness of protection layer 116 is sufficient to prevent etching through capacitor top layer 114 during the contact formation processes. In some embodiments, protection layer 116 includes silicon oxynitride, silicon nitride, silicon carbide, or another suitable material.

Top dielectric layer 118 that is over protection layer 116. Top dielectric layer 118 provides extra protection for capacitor top layer 114 during contact formation processes by protecting both the top surface of capacitor top layer 114 and sidewalls of the capacitor top layer. In some embodiments, top dielectric layer 118 is a single layer. In some embodiments, top dielectric layer 118 is a multi-layer structure. In some embodiments, top dielectric layer 118 includes silicon oxide, silicon nitride, silicon oxynitride, silicon carbide, silicon oxycarbide, silicon carbon nitride, other dielectric materials, and/or any combinations thereof. In some embodiments, top dielectric layer 118 is a dual-layer structure including a silicon oxide layer and a silicon nitride layer formed thereon. In some embodiments where cap layer 120 and protection layer 116 provide sufficient protection for capacitor top layer 114, top dielectric layer 118 is omitted.

Cap layer 120 that is over top dielectric layer 118. Cap layer 120 provides extra protection for capacitor top layer 114 during contact formation processes by protecting both the top surface of capacitor top layer 114 and sidewalls of the capacitor top layer. In some embodiments, cap layer 120 is a single layer. In some embodiments, cap layer 120 is a multi-layer structure. In some embodiments, cap layer 120 includes silicon oxide, silicon nitride, silicon oxynitride, silicon carbide, silicon oxycarbide, silicon carbon nitride, other dielectric materials, and/or any combinations thereof. In some embodiments, cap layer 120 is a dual-layer structure including a silicon oxide layer and a silicon nitride layer formed thereon. In some embodiments where top dielectric layer 118 and protection layer 116 provide sufficient protection for capacitor top layer 114, cap layer 120 is omitted.

Figure 2:
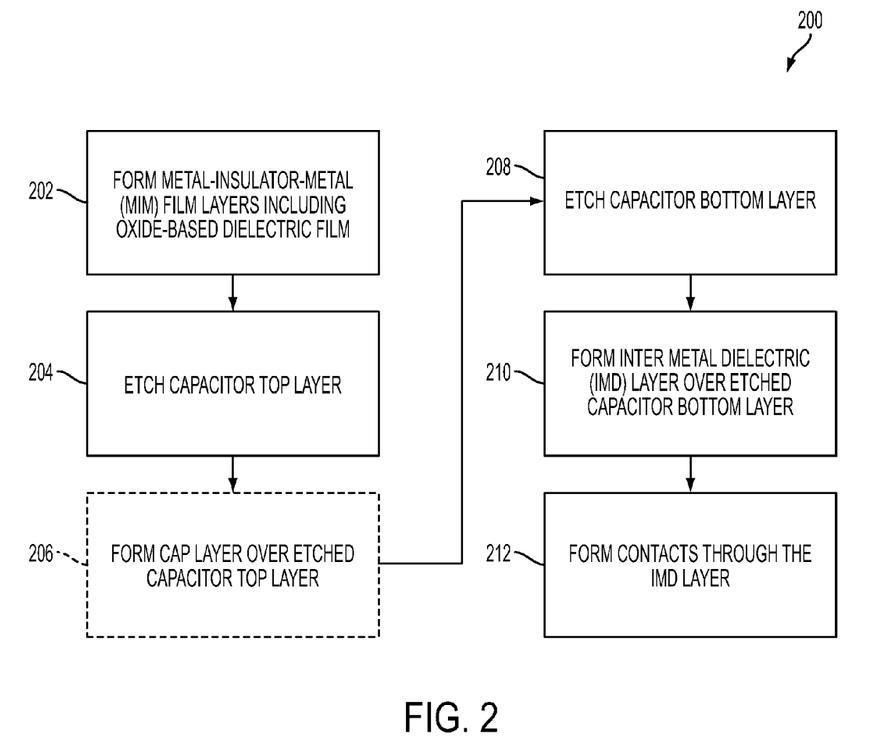
FIG. 2 is a flowchart of a method of forming an MIM capacitor in accordance with one or more embodiments.

FIG. 2 is a flow chart of a method 200 of forming an MIM capacitor in accordance with one or more embodiments. Method 200 begins with operation 202 in which MIM film layers, including an oxide-based dielectric film, are formed. In some embodiments, the MIM film layers include an etch stop layer; the oxide-based dielectric layer over the etch stop layer; a capacitor bottom layer over the oxide-based dielectric layer; an insulator layer over the capacitor bottom layer; a capacitor top layer over the insulator layer; and a protection layer over the capacitor top layer.

In some embodiments, the MIM film layers are blanket deposited over a base layer including a copper bulk layer in the base layer. In some embodiments, the MIM film layers are selectively deposited using a mask. In some embodiments, at least one of the MIM film layers is deposited in a separate chamber. In some embodiments, the MIM film layers are deposited in a same chamber using different materials.

In some embodiments, dielectric layers of the MIM film layers are formed by a chemical vapor deposition (CVD) process, a plasma-enhanced CVD (PECVD) process, a physical vapor deposition (PVD) process, an atomic layer deposition (ALD), other suitable process, or any combinations thereof. In some embodiments, metallic layers of the MIM film layers are formed by a CVD process, a PVD process, an ALD process, an electroplating process, another process, or any combinations thereof. In some embodiments, a removal process, e.g., a chemical mechanical polish (CMP) process, is performed between formations of subsequent layers in the MIM film layers.

Figure 3A:
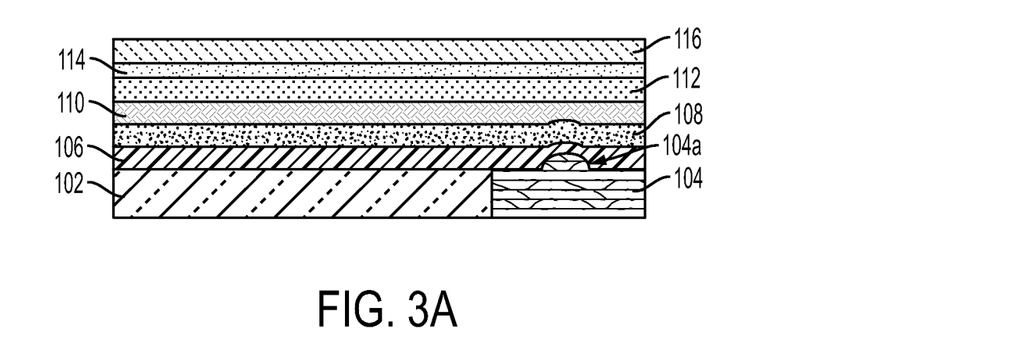
FIGS. 3A-3F are cross-sectional views of an MIM capacitor during various fabrication stages in accordance with one or more embodiments.

FIG. 3A is a cross-sectional view of an MIM capacitor following operation 202 in accordance with one or more embodiments. The arrangement of FIG. 3A includes etch stop layer 106, oxide-based dielectric layer 108, capacitor bottom layer 110, insulator layer 112, capacitor top layer 114, and protection layer 116 blanket deposited over base layer 102 including copper bulk layer 104. The arrangement of FIG. 3A includes a hillock 104a in copper bulk layer 104. Hillock 104a impacts a profile of etch stop layer 106 and oxide-base layer 108.

Returning to FIG. 2, method 200 continues with etching the capacitor top layer in operation 204. In some embodiments, etching the capacitor top layer also includes etching the protection layer. The capacitor top layer is etched in order to expose a portion of the insulator layer to enable formation of a contact with the capacitor bottom layer.

In some embodiments, the capacitor top layer is etched using a photolithographic process. The photo lithographic process includes depositing a mask layer over the capacitor top layer, developing and patterning the mask layer to form openings in the mask layer. The capacitor top layer is then etched through the openings in the mask layer. In some embodiments, the etching process includes a dry etching process, a wet etching process, another suitable material removal process or a combination thereof.

Figure 3B:
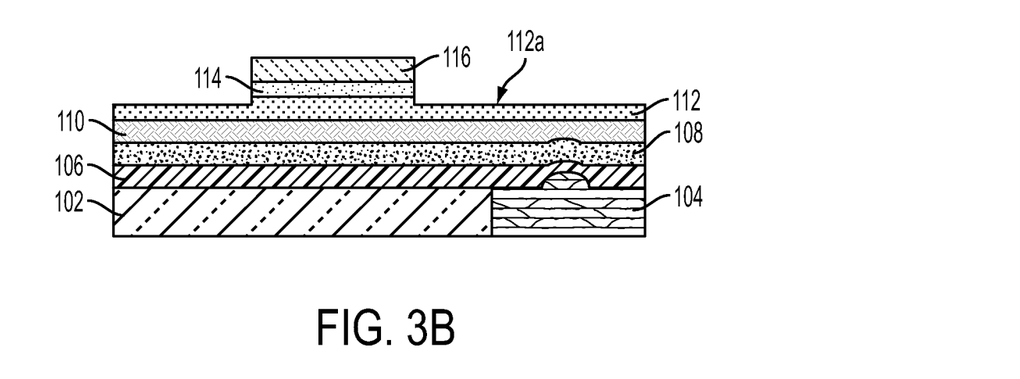

FIG. 3B is a cross-sectional view of an MIM capacitor following operation 204 in accordance with one or more embodiments. In comparison with the arrangement of FIG. 3A, the arrangement of FIG. 3B includes a capacitor top layer 114 and protection layer 116 which have a reduced size and expose top surface 112a. The arrangement of FIG. 3B includes a remaining portion of capacitor top layer 114 offset from a center of the MIM capacitor. In some embodiments, the remaining portion of capacitor top layer 114 is aligned with an edge of the MIM capacitor. In some embodiments, the remaining portion of capacitor top layer 114 is centered in the MIM capacitor.

Returning to FIG. 2, method 200 continues with optional operation 206 in which a cap layer is formed over the etched capacitor top layer. In some embodiments, forming the cap layer includes forming a separate top dielectric layer over the etched capacitor top layer prior to forming the cap layer. In some embodiments, forming the cap layer includes forming a single layer. In some embodiments, forming the cap layer includes forming a multi-layered structure.

In some embodiments, the cap layer is formed using a CVD process, a PECVD process, a PVD process, an ALD, another suitable process, or any combinations thereof. In some embodiments, the cap layer is selectively formed over the etched capacitor top layer. In some embodiments, the cap layer is blanket deposited over the etched capacitor top layer and the top surface of the insulator layer exposed during operation 204.

In some embodiments, operation 206 is omitted. Operation 206 is omitted if the protection layer provides sufficient protection of the capacitor top layer during subsequent contact formation processes.

Figure 3C:
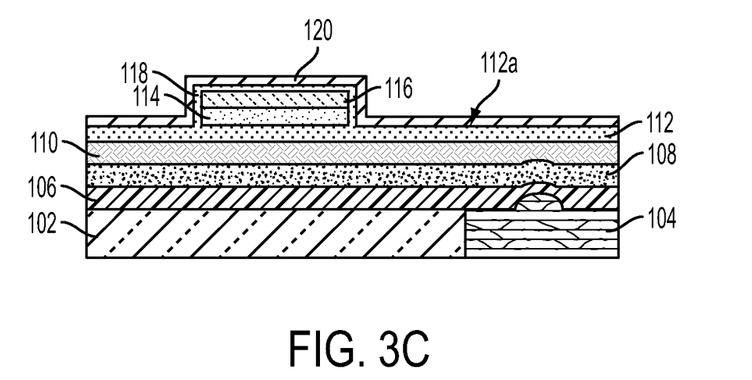

FIG. 3C is a cross-sectional view of an MIM capacitor following operation 206 in accordance with one or more embodiments. In comparison with the arrangement of FIG. 3B, the arrangement of FIG. 3C includes top dielectric layer 118 and cap layer 120 over protection layer 116, capacitor top layer 114 and top surface 112a.

Returning to FIG. 2, method 200 continues with etching the capacitor bottom layer in operation 208. In some embodiments, etching the capacitor bottom layer also includes etching the insulator layer. The capacitor bottom layer is etched in order to expose a portion of the oxide-based dielectric layer to enable formation of a contact with the copper bulk layer.

In some embodiments, the capacitor bottom layer is etched using a photolithographic process. The photo lithographic process includes depositing a mask layer over the capacitor bottom layer, developing and patterning the mask layer to form openings in the mask layer. The capacitor bottom layer is then etched through the openings in the mask layer. In some embodiments, the etching process includes a dry etching process, a wet etching process, another suitable material removal process or a combination thereof.

Figure 3D:
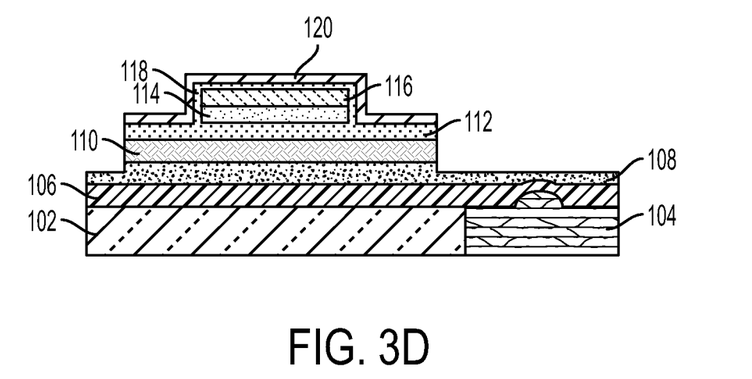

FIG. 3D is a cross-sectional view of an MIM capacitor following operation 208 in accordance with one or more embodiments. In comparison with the arrangement of FIG. 3C, the arrangement of FIG. 3D includes capacitor bottom layer 110 and insulator layer 112 which have a reduced size and expose top surface 108a. The arrangement of FIG. 3D includes a remaining portion of capacitor bottom layer 110 offset from a center of the MIM capacitor. In some embodiments, the remaining portion of capacitor bottom layer 110 is aligned with an edge of the MIM capacitor. In some embodiments, the remaining portion of capacitor bottom layer 110 is centered in the MIM capacitor.

Returning to FIG. 2, method 200 continues with operation 210 in which an inter metal dielectric (IMD) layer is formed over the etched capacitor bottom layer. In some embodiments, more than one IMD layer is formed over the etched capacitor bottom layer. In some embodiments, the more than one IMD layers are separated by an etch stop layer. In some embodiments, the IMD layer includes silicon oxide, e.g., undoped silicate glass (USG), boron-doped silicate glass (BSG), phosphor-doped silicate glass (PSG), boron-phosphor-doped silicate glass (BPSG), or the like, silicon oxynitride, silicon nitride, a low dielectric constant (low-k) material, an ultra-low-k dielectric material, and/or any combinations thereof.

Figure 3E:
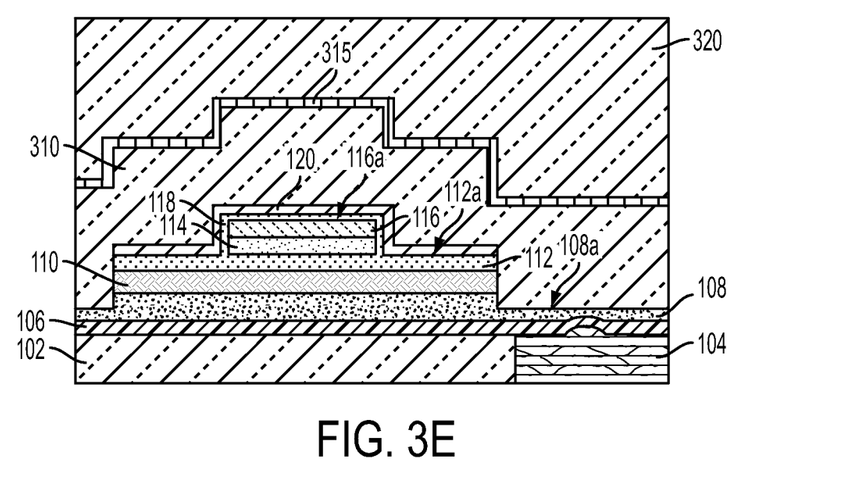

FIG. 3E is a cross-sectional view of an MIM capacitor following operation 210 in accordance with one or more embodiments. In comparison with the arrangement of FIG. 3D, the arrangement of FIG. 3E includes a first IMD layer 310 over etched capacitor bottom layer 110. The arrangement of FIG. 3E further includes an etch stop layer 315 over first IMD layer 310 and a second IMD layer 320 over the etch stop layer.

In some embodiments, first IMD layer 310 and second IMD layer 320 include a same material. In some embodiments, first IMD layer 310 and second IMD layer 320 include different materials. In some embodiments, etch stop layer 320 includes a same material as etch stop layer 106. In some embodiments, etch stop layer 320 includes a different material from etch stop layer 106.

First IMD layer 310 is conformal with remaining portions of the MIM film layers. A thickness of first IMD layer 310 over top surface 108a is substantially equal to a thickness of the first IMD layer over top surface 112a and top surface 116a. Due to the substantially equal thicknesses, an etching time to form an opening in first IMD layer 310 for a contact is substantially equal for capacitor top layer 114, capacitor bottom layer 110 and copper bulk layer 104. The substantially equal etching time for each of the contact openings helps to reduce the risk of over etching and damaging of capacitor top layer 114, capacitor bottom layer 110 or copper bulk layer 104.

Etch stop layer 315 is conformal with first IMD layer 310. Etch stop layer 315 provides an etch stop so that etching second IMD layer 320 to form openings for an interconnect structure does not damage first IMD layer 310.

Second IMD layer 320 is conformal with etch stop layer 315. In some embodiments, second IMD layer 320 is part of an interconnect structure.

Returning to FIG. 2, method 200 continues with operation 212 in which contacts are formed through the IMD layer. A first contact is formed to electrically connect to the capacitor top layer. A second contact is formed to electrically connect to the capacitor bottom layer. A third contact is formed to electrically connect to the copper bulk layer. In some embodiments, the contacts include at least one barrier material and at least one conductive material. In some embodiments, the at least one barrier material includes titanium, titanium-nitride, tantalum, tantalum-nitride, other barrier materials, or combinations thereof. In some embodiments, the at least one conductive material includes aluminum, copper, aluminum-copper, polysilicon, other conductive materials, or combinations thereof. In some embodiments, the contacts are via plug structures, single damascene structures, conductive bulks, conductive slats, conductive lines, or any other conductive structure shape. In some other embodiments, the contacts are part of a dual damascene structure.

In some embodiments, the contacts are formed using a photolithography/etching process to form an opening in the IMD layer. The opening is then filled with the contact, e.g., the at least one barrier layer and the at least one conductive layer. In some embodiments, a CMP process is then used to remove excess contact material from a top surface of the IMD layer. In some embodiments, at least one contact is formed separately. In some embodiments, all contacts are formed simultaneously. In some embodiments, the openings for each contact are formed separately and each opening is filled simultaneously.

Figure 3F:
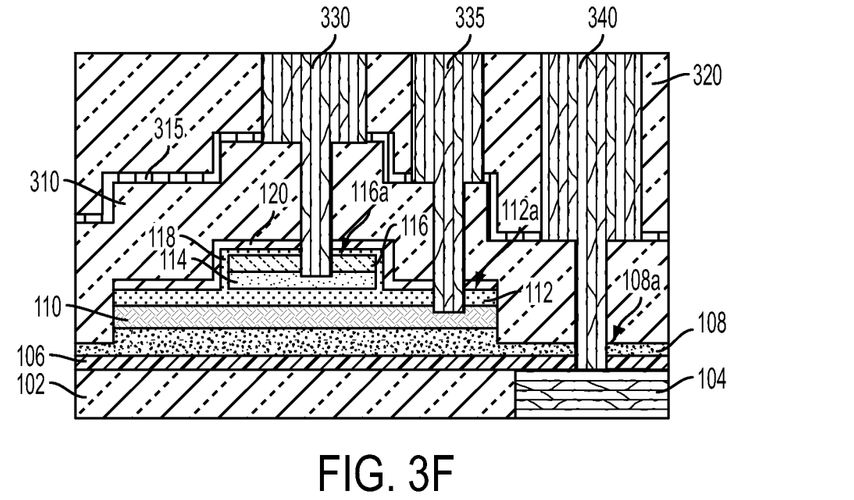

FIG. 3F is a cross-sectional view of an MIM capacitor following operation 212 in accordance with one or more embodiments. In comparison with the arrangement of FIG. 3E, the arrangement of FIG. 3F includes a first contact 330 electrically connected to capacitor top layer 114; a second contact 335 electrically connected to capacitor bottom layer 110; and a third contact 340 electrically connected to copper bulk layer 104. In the arrangement of FIG. 3F, second contact 335 is positioned between first contact 330 and third contact 340. In some embodiments, first contact 330 is positioned between second contact 335 and third contact 340.

First contact 330 extends through second IMD layer 320; etch stop layer 315, first IMD layer 310, cap layer 120, top dielectric layer 118 and protection layer 116 in order to electrically connect to capacitor top layer 114.

Second contact 335 extends through second IMD layer 320; etch stop layer 315, first IMD layer 310, and insulator layer 112 in order to electrically connect to capacitor bottom layer 110.

Third contact 340 extends through second IMD layer 320, etch stop layer 315, first IMD layer 310, oxide-based dielectric layer 108 and etch stop layer 106 in order to electrically connect to copper bulk layer 104. The inclusion of oxide-based dielectric layer 108 helps to ensure that third contact 340 is electrically connected to copper bulk layer 104 by preventing damage to the copper bulk layer during the etching process used to form the opening for the third contact. As a result, electrical signals are able to be transmitted from copper bulk layer 104 to third contact 340.

One of ordinary skill in the art would recognize that additional operations are able to be added to method 200 in order to form a finished device. One of ordinary skill in the art would also recognize that an order of operations is able to be changed and operations are able to be combined or separated.

One aspect of this description relates to a metal insulator metal (MIM) capacitor. The MIM capacitor includes a base layer and a copper bulk layer in the base layer. The MIM capacitor further includes an etch stop layer over the base layer and the copper bulk layer and an oxide-based dielectric layer over the etch stop layer. The MIM capacitor further includes a capacitor bottom layer over the oxide-based dielectric layer, an insulator layer over the capacitor bottom layer, a capacitor top layer over the insulator layer, and a protection layer over the capacitor top layer.

Another aspect of this description relates to a metal insulator metal (MIM) capacitor. The MIM capacitor includes a base layer and a copper bulk layer in the base layer. The MIM capacitor further includes an etch stop layer over the base layer and the copper bulk layer and an oxide-based dielectric layer over the etch stop layer. The MIM capacitor further includes a capacitor bottom layer over the oxide-based dielectric layer, wherein the capacitor bottom layer exposes a portion of a top surface of the oxide-based dielectric layer. The MIM capacitor further includes an insulator layer over the capacitor bottom layer and a capacitor top layer over the insulator layer, wherein the capacitor top layer exposes a portion of a top surface of the insulator layer. The MIM capacitor further includes a first contact electrically connected to the capacitor top layer, a second contact electrically connected to the capacitor bottom layer through the exposed portion of the top surface of the insulator layer, and a third contact electrically connected to the copper bulk layer through the exposed portion of the top surface of the oxide-based dielectric layer.

Still another aspect of this description relates to a method of making a metal insulator metal (MIM) capacitor. The method includes forming a copper bulk layer in a base layer and forming an etch stop layer over the base layer and the copper bulk layer. The method further includes forming an oxide-based dielectric layer over the etch stop layer and forming a capacitor bottom layer over the oxide-based dielectric layer. The method further includes forming an insulator layer over the capacitor bottom layer and forming a capacitor top layer over the insulator layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A metal insulator metal (MIM) capacitor comprising:
a base layer;
a copper bulk layer in the base layer;
an etch stop layer over the base layer and the copper bulk layer, wherein the etch stop layer comprises a first bump or hillock, and a top of the first bump or hillock is above a top surface of a portion of the etch stop layer over the base layer;
an oxide-based dielectric layer over the etch stop layer, wherein the oxide-based dielectric layer comprises a second bump or hillock, the second bump or hillock protruding away from the copper bulk layer, and the second bump or hillock is aligned with the first bump or hillock;
a capacitor bottom layer over the oxide-based dielectric layer;
an insulator layer over the capacitor bottom layer;
a capacitor top layer over the insulator layer
a protection layer over the capacitor top layer;
a top dielectric layer over the protection layer; and
a cap layer over the top dielectric layer, wherein the cap layer directly contacts the insulator layer.

2. The MIM capacitor of claim 1, wherein the oxide-based dielectric layer comprises at least one of a silicon oxide, a silicon-rich silicon oxide, or a TEOS (tetraethoxysilane; tetraethylorthosilicate; tetraethelorthosilicate; tetrethoxysilicide) oxide.

3. The MIM capacitor of claim 1, wherein the oxide-based dielectric layer has a thickness ranging from about 50 angstroms (Å) to about 2000 Å.

4. The MIM capacitor of claim 1, wherein the capacitor bottom layer is configured to expose a portion of a top surface of the oxide-based dielectric layer.

5. The MIM capacitor of claim 4, further comprising an inter metal dielectric (IMD) layer over the capacitor top layer, wherein the IMD layer is in contact with the exposed top surface of the oxide-based dielectric layer.

6. The MIM capacitor of claim 5, wherein the oxide-based dielectric layer has a same etching characteristic as the IMD layer.

7. The MIM capacitor of claim 5, wherein a thickness of the IMD layer over the capacitor top layer is substantially equal to a thickness of the IMD layer over the exposed top surface of the oxide-based dielectric layer.

8. The MIM capacitor of claim 1, wherein the top dielectric layer directly contacts sidewalls of the capacitor top layer.

9. The MIM capacitor of claim 1, wherein the cap layer covers sidewalls of the protection layer and sidewalls of the capacitor top layer.

10. The MIM capacitor of claim 9, wherein the top dielectric layer is between the cap layer and the protection layer, and between the cap layer and the capacitor top layer.

11. The MIM capacitor of claim 1, wherein a thickness of the oxide-based dielectric overlapped by the capacitor top layer is substantially constant.

12. A metal insulator metal (MIM) capacitor comprising:
a base layer;
a copper bulk layer in the base layer;
an etch stop layer over the base layer and the copper bulk layer;
an oxide-based dielectric layer over the etch stop layer;
a capacitor bottom layer over the oxide-based dielectric layer, wherein the capacitor bottom layer exposes a portion of a top surface of the oxide-based dielectric layer, wherein a top surface of the portion of the oxide-based dielectric layer is lower than a top surface of the oxide-based dielectric layer covered by the capacitor bottom layer;
an insulator layer over the capacitor bottom layer;
a capacitor top layer over the insulator layer, wherein the capacitor top layer exposes a portion of a top surface of the insulator layer;
an inter metal dielectric (IMD) layer over the capacitor top layer, wherein the IMD layer is in contact with the exposed top surface of the oxide-based dielectric layer;
a first contact electrically connected to the capacitor top layer;

a second contact electrically connected to the capacitor bottom layer through the exposed portion of the top surface of the insulator layer; and a third contact electrically connected to the copper bulk layer through the exposed portion of the top surface of the oxide-based dielectric layer.

13. The MIM capacitor of claim 12, wherein the oxide-based dielectric layer comprises at least one of a silicon oxide, a silicon-rich silicon oxide, or a TEOS (tetraethoxysilane; tetraethylorthosilicate; tetraethelorthosilicate; tetrethoxysilicide) oxide.

14. The MIM capacitor of claim 12, wherein the oxide-based dielectric layer has a thickness ranging from about 50 angstroms (Å) to about 2000 Å.

15. The MIM capacitor of claim 12, wherein the oxide-based dielectric layer has a same etching characteristic as the IMD layer.

16. The MIM capacitor of claim 12, wherein a sidewall of the capacitor bottom layer is exposed to the IMD layer.

17. A metal insulator metal (MIM) capacitor comprising:
a base layer;
a copper bulk layer in the base layer, wherein the copper bulk layer comprises a bump or hillock on a top surface thereof, and the bump or hillock extends above a top surface of the base layer;
a dielectric layer over the copper bulk layer, wherein the dielectric layer comprises:
a first region having a first thickness, and
a second region having a second thickness different from the first thickness;
a capacitor bottom layer over the first region of the dielectric layer;
an insulator layer over the capacitor bottom layer; and
a capacitor top layer over the insulator layer, wherein the capacitor top layer is over the first region of the dielectric layer, and a thickness of an entire portion of the dielectric layer overlapped by the capacitor top layer is substantially constant.

18. The MIM capacitor of claim 17, further comprising an etch stop layer between the copper bulk layer and the dielectric layer, wherein the etch stop layer comprises a bump or hillock corresponding to the bump or hillock of the copper bulk layer.

19. The MIM capacitor of claim 17, wherein the second region of the dielectric layer is over the bump or hillock of the copper bulk layer.

20. The MIM capacitor of claim 17, further comprising a protection layer over the capacitor top layer.

* * * * *